(12) United States Patent
Zhang et al.

(10) Patent No.: US 10,366,667 B2
(45) Date of Patent: Jul. 30, 2019

(54) ARRAY SUBSTRATE AND DISPLAY PANEL

(71) Applicant: Wuhan China Star Optoelectronics Technology Co., Ltd., Wuhan, Hubei (CN)

(72) Inventors: Tingting Zhang, Guangdong (CN); Cong Wang, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/737,308

(22) PCT Filed: Nov. 15, 2017

(86) PCT No.: PCT/CN2017/106959
§ 371 (c)(1),
(2) Date: Dec. 17, 2017

(87) PCT Pub. No.: WO2019/061590
PCT Pub. Date: Apr. 4, 2019

(65) Prior Publication Data
US 2019/0096346 A1    Mar. 28, 2019

(30) Foreign Application Priority Data
Sep. 26, 2017 (CN) .......................... 2017 1 0887760

(51) Int. Cl.
*G02F 1/1362* (2006.01)
*G09G 3/36* (2006.01)
(Continued)

(52) U.S. Cl.
CPC ......... *G09G 3/3648* (2013.01); *G02F 1/1368* (2013.01); *G02F 1/136286* (2013.01);
(Continued)

(58) Field of Classification Search
CPC ........... G02F 1/136286; G02F 1/13306; G02F 1/1362; G02F 1/136213; G02F 1/1368;
(Continued)

(56) References Cited

U.S. PATENT DOCUMENTS 8,692,752 B2   4/2014   Chang et al.
9,335,573 B2   5/2016   Lv et al.
(Continued)

FOREIGN PATENT DOCUMENTS

CN    105278192 A    1/2016
CN    106873273 A    6/2017

*Primary Examiner* — Hong Zhou
(74) *Attorney, Agent, or Firm* — Andrew C. Cheng

(57) ABSTRACT

The present disclosure relates to an array substrate and a display panel. The array substrate includes a plurality of scanning lines and a plurality of data lines intersecting with each other to form a plurality of pixel cells. The pixel cells are divided into the pixel cells within a first area and the pixel cells within a second area along the scanning lines. Each of the pixel cells within the second area includes a first thin film transistor (TFT) and a control unit connected to the first TFT. The control unit is configured to reduce a pixel voltage of the pixel cell where the first TFT is configured. As such, the display panel may display images uniformly, and display performance of the display panel may be improved.

14 Claims, 4 Drawing Sheets

(51) Int. Cl.
 *H01L 27/12* (2006.01)
 *G02F 1/1368* (2006.01)
(52) U.S. Cl.
 CPC ......... *G09G 3/3677* (2013.01); *H01L 27/124* (2013.01); *H01L 27/1255* (2013.01); *G09G 2300/0819* (2013.01); *G09G 2320/0233* (2013.01)
(58) Field of Classification Search
 CPC ......... G09G 2320/0223; G09G 3/3648; G09G 3/3677; G09G 2300/0819; G09G 2320/0233; H01L 27/124; H01L 27/1255
 See application file for complete search history.

(56) References Cited

U.S. PATENT DOCUMENTS

| | | |
|---|---|---|
| 9,564,454 B2 | 2/2017 | Cao |
| 10,013,929 B2 | 7/2018 | Du et al. |
| 2007/0126940 A1 | 6/2007 | Lee |
| 2008/0291186 A1 | 11/2008 | Chu et al. |
| 2010/0033470 A1* | 2/2010 | Lee ................. G02F 1/13624 345/212 |
| 2011/0115782 A1* | 5/2011 | Song ................. G09G 3/3659 345/213 |
| 2012/0033148 A1* | 2/2012 | Yang ................. G02F 1/134309 349/39 |
| 2012/0194566 A1* | 8/2012 | Lan ................. G09G 3/3659 345/690 |
| 2014/0285478 A1 | 9/2014 | Ono |
| 2016/0116811 A1* | 4/2016 | Zheng ............... G02F 1/133512 349/38 |
| 2017/0148409 A1 | 5/2017 | Sun |

\* cited by examiner

ARRAY SUBSTRATE AND DISPLAY PANEL

BACKGROUND

1. Technical Field

The present disclosure relates to a display field, and more particularly to an array substrate and a display panel.

2. Description of Related Art

The thin film transistor (TFT) adopted in display devices mainly includes amorphous silicon TFTs and poly-silicon TFTs. With the increasing of the using time, mobility and photosensitivity of the amorphous silicon TFTs may be largely reduced. However, the low temperature poly-silicon (LTPS) may have better mobility and stability when comparing with the amorphous silicon.

The gate driver on array (GOA) of the LTPS panels usually adopts the one-way driving interlaced scanning mode. That is, the gate drivers are configured on both sides of the LTPS panel, and the gate drivers may be turned on according to the scanning timings of the scanning lines. However, the signals may have time difference between the starting end and the terminal end of the scanning line due to the time-delay of the resistor and the capacitor, resulting in an impact on the pixel voltages of the pixel cells on the starting end and the terminal end. When the size of the panel becomes larger and the scanning line becomes longer, the time-delay of the resistor and the capacitor may become greater. A greater difference of the pixel voltage between the pixel cells configured on the starting end and the terminal end of the scanning line may occur. As such, the brightness of the both sides of the display panel may be greater than that of the center of the panel, resulting in a non-uniform display.

SUMMARY

The present disclosure relates to an array substrate, including: a plurality of scanning lines; a plurality of data lines, wherein the data lines and the scanning lines respectively intersect with each other to form a plurality of pixel cells; wherein the pixel cells are divided into the pixel cells within a first area and the pixel cells within a second area along the scanning lines, and a distance between the first area and an input end of scanning signals is less than a distance between the second area and the input end of the scanning signals; each of the pixel cells within the second area includes a first thin film transistor (TFT) and a control unit connected to the first TFT, the control unit is configured to reduce a pixel voltage of the pixel cell where the first TFT is configured, and each of the pixel cells within the first area includes a second TFT.

The present disclosure relates to a display panel, including: the array substrate.

In view of the above, each of the pixel cells within the second area, wherein the distance between the second area and the input end of scanning signals is greater than the distance between the first area and the input end of the scanning signals, includes the control unit configured to reduce the pixel voltage of the pixel cells within the second area. So as to equalize the pixel voltage of the pixel cells over the array substrate. As such, the whitening problem occurred in the right-side rim and the left-side rim of the panel may be solved, the display panel may display images uniformly, and display performance of the display panel may be improved.

DETAILED DESCRIPTION

To clarify the purpose, technical solutions, and the advantages of the disclosure, embodiments of the invention will now be described more fully hereinafter with reference to the accompanying drawings.

Figure 1:
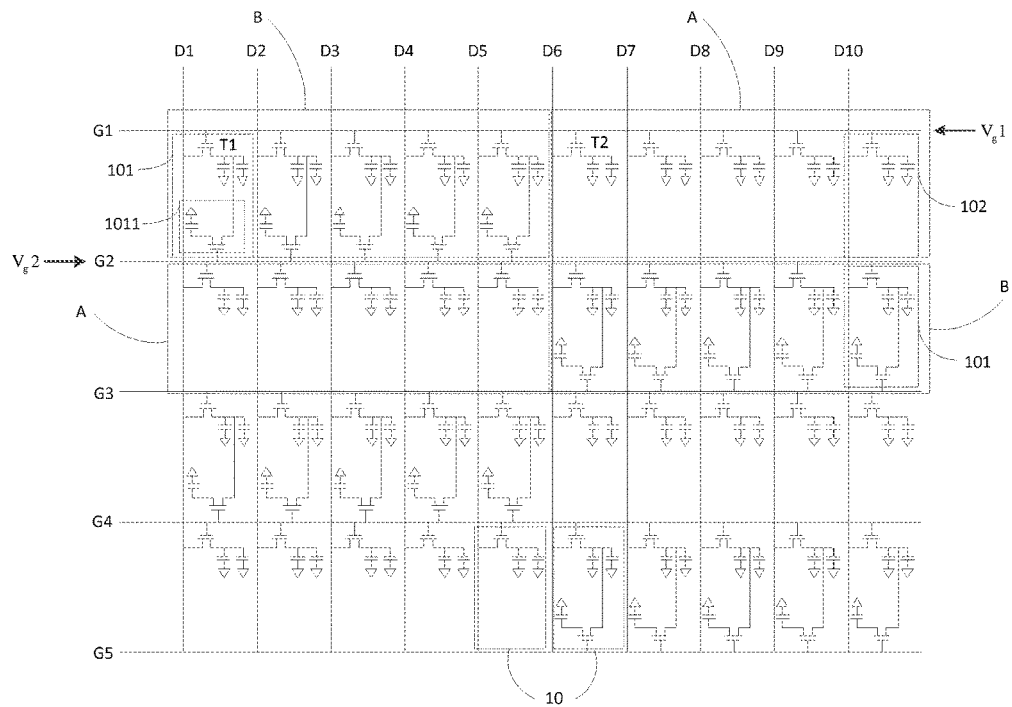
FIG. 1 is a schematic view of an array substrate in accordance of one embodiment of the present disclosure.
Figure 2:
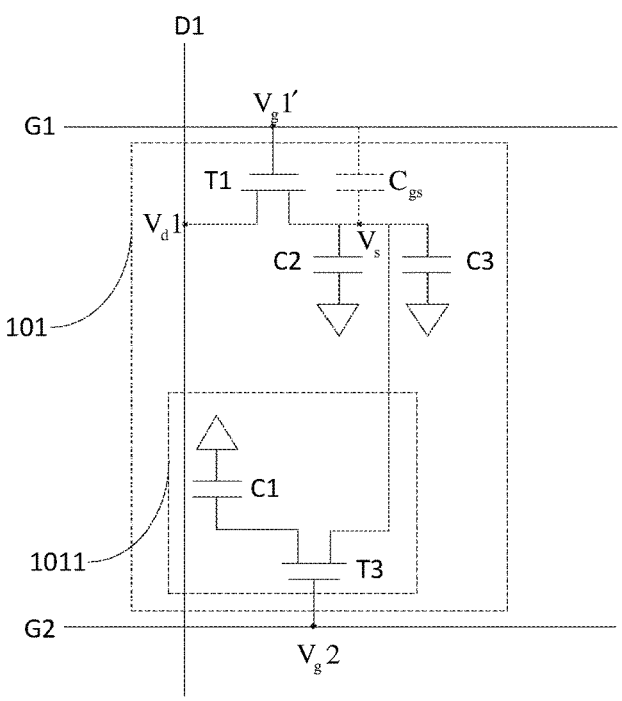
FIG. 2 is a schematic view of a pixel cell within a second area of an array substrate in accordance of one embodiment of the present disclosure.
Figure 3:
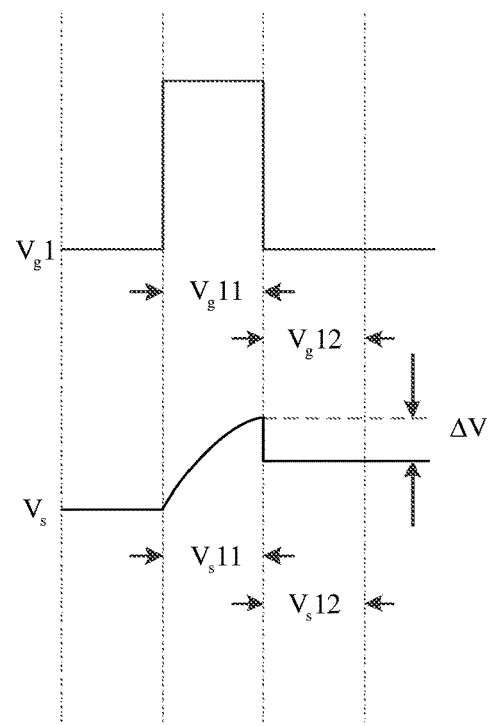
FIG. 3 is a waveform diagram of a pixel cell within a first area of the array substrate in accordance of one embodiment of the present disclosure.
Figure 4:
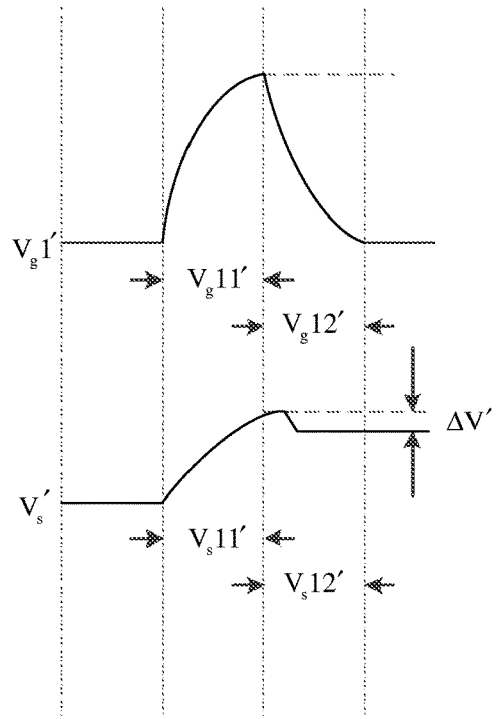
FIG. 4 is a waveform diagram of the pixel cell within the second area of the array substrate in accordance of one embodiment of the present disclosure.

Referring to FIG. 1, the present disclosure relates to an array substrate, including: a plurality of scanning lines Gn (for example G1, G2, G3, G4 and G5 in the present embodiment), a plurality of data lines Dn (for example D1, D2, D3, D4, D5, D6, D7, D8, D9 and D10 in the present embodiment). The data lines Dn and the scanning lines Gn respectively intersect with each other to form a plurality of pixel cells 10.

The pixel cells 10 may be divided into the pixel cells within a first area (A) and the pixel cells within a second area (B) along a direction of the scanning lines Gn. A distance between the first area (A) and an input end of scanning signals is less than a distance between the second area (B) and the input end of the scanning signals. Each of the pixel cells 101 within the second area (B) includes a first thin film transistor (TFT) T1 and a control unit 1011 connected to the first TFT T1. The control unit 1011 is configured to reduce a pixel voltage of the pixel cell 101 where the first TFT T1 is configured. Each of the pixel cells 102 within the first area (A) includes a second TFT T2.

Specifically, an interlaced scanning process is conducted on the array substrate by at least two gate drivers on array (GOA) (not shown) configured on both sides of the array substrate. That is, the GOA on a right-side of the array substrate may input the scanning signals to odd-number rows of the scanning lines, and the GOA on a left-side of the array substrate may input the scanning signals to even-number rows of the scanning lines. The odd-number rows of the scanning lines and the even-number rows of the scanning lines may input the scanning signals in an alternating manner.

In another example, the GOA on the right-side of the array substrate may input the scanning signals to the even-number rows of the scanning lines, and the GOA on the left-side of the array substrate may input the scanning signals to the odd-number rows of the scanning lines.

In one example, the first area (A) and the second area (B) may be divided by a mid-line. That is, the first area (A) and the second area (B) may be divided by a connection line of mid-points of each of the scanning lines Gn. For example, when the scanning signals at a current row are inputted from the right-side of the array substrate, the pixel cells within a right-side of the mid-line are configured to be in the first area (A), and the pixel cells within a left-side of the mid-line are configured to be in the second area (B). In another example, the first area (A) and the second area (B) may be divided by a whitening area at the current row. For example, when the scanning signals at the current row are inputted from the right-side of the array substrate, the whitening area located at a left-side rim of the current row is configured to be the second area (B), and a non-whitening area located at a right-side rim of the current row is configured to be the first area (A). In another example, the first area (A) and the second area (B) may be divided by the whitening area at a different row. For example, when the scanning signals at the current row are inputted from the right-side of the array substrate, the whitening area located at the left-side rim of the current row is configured to be the second area (B), and an area at the current row corresponding to the whitening area at a next row is configured to be the first area (A).

Referring to FIGS. 1 to 4, with respect to the pixel cells 101 within the second area (B), the control unit 1011 may include a third TFT T3 and a first capacitor C1. A drain of the third TFT T3 connects to a pixel electrode of the pixel cell 101 where with the third TFT T3 is configured. A gate of the third TFT T3 connects to a scanning line G2 at the next row. A source of the third TFT T3 is grounded via the first capacitor C1. Wherein the first capacitor C1 is equivalently formed by a source of the first TFT T1 and a common electrode. The pixel cell 101 within the second area (B) further includes a first liquid crystal capacitor C2 and a first storage capacitor C3. The source of the first TFT T1 connects to the data line D1. A gate of the first TFT T1 connects to a scanning line G1 at the current row. A drain of the first TFT T1 connects to the pixel electrode of the pixel cell 101 where the first TFT T1 is configured. Wherein the first liquid crystal capacitor C2 is equivalently formed by the pixel electrode of the pixel cell 101, where the first TFT T1 is configured, and the common electrode on a color film substrate (not shown). The first storage capacitor C3 is equivalently formed by the pixel electrode of the pixel cell 101, where the first TFT T1 is configured, and other metal lines on the array substrate.

The drain of the third TFT T3 is configured between one end of the first liquid crystal capacitor C2 and one end of the first storage capacitor C3.

With respect to the pixel cells 101 within the second area (B), when the scanning line G1 at the current row inputs the scanning signals $V_g1$, that is, the scanning line G1 inputs the scanning signals from the right-side of the array substrate, the third TFT T3 at the current row may be turned off, and the first TFT T1 and the second TFT T2 at the current row may be turned on. An input end of the scanning line G2 at the next row is opposite to that of the scanning line G1 at the current row, that is, the scanning line G2 inputs the scanning signals from the left-side of the array substrate. As such, the pixel cell 101 within the second area (B) connected to the scanning line G2 at the next row and the pixel cell 101 within the second area (B) connected to the scanning line G1 at the current row may connect to different data lines. With respect to the pixel cells 101 within the second area (B), when the scanning line G2 at the next row inputs the scanning signals $V_g2$, the third TFT T3 at the current row may be turned on, the first TFT T1 at the current row and the second TFT T2 at the current row may be turned off. The third TFT T3 at the current row is configured to pull-down the pixel voltage of the current row.

Specifically, when the scanning line G1 at the current row inputs the scanning signals $V_g1$, the third TFT T3 at the current row may be turned off, the first TFT T1 at the current row and the second TFT T2 at the current row may be turned on. A voltage may be inputted by the data line D1. A source voltage of the first TFT T1 of the pixel cell 101 within the second area (B) is configured to be $V_d1$. A gate voltage of the first TFT T1 is configured to be $V_g11'$. A pixel voltage, i.e., a drain voltage, of the first TFT T1 is configured to be $V_s11'$. A source voltage of the second TFT T2 of the pixel cell 102 within the first area (A) is configured to be $V_d2$. A gate voltage of the second TFT T2 is configured to be $V_g11$. A pixel voltage, i.e., the drain voltage, of the second TFT T2 is configured to be $V_s11$. When the scanning signals $V_g1$ of the scanning line G1 at the current row are turned off, the first TFT T1 may be turned off. The source voltage of the first TFT T1 of the pixel cell 101 within the second area (B) is configured to be $V_d1$. The gate voltage of the first TFT T1 is configured to be $V_g12'$. The pixel voltage of the first TFT T1 is configured to be $V_s12'$. The source voltage of the second TFT T2 of the pixel cell 102 within the first area (A) is configured to be $V_d2$. The gate voltage of the second TFT T2 is configured to be $V_g12$. The pixel voltage, i.e., the drain voltage, of the second TFT T2 is configured to be $V_s12$. A cascaded-capacitor, i.e., a parasitic capacitance $C_{gs}$, may be formed within a component of the pixel cell 101 within the second area (B). According to law of charge conservation, a feed through voltage $\Delta V$ may be configured to be as $\Delta V = (V_g11 - V_g12) * C_{gs}/C_{gs} + C2 + C3)$, and the feed through voltage may be configured to be as $\Delta V = V_d - V_s12$. As such, the pixel voltage $V_s12$ of the first TFT T1 may be configured to be as $V_s12 = V_d - (V_g11 - V_g12) * C_{gs}/(C_{gs} + C2 + C3)$.

Specifically, due to the distance between the pixel cells 102 within the first area (A) and the input end of the scanning signals $V_g1$ is less than the distance between the pixel cell 101s within the second area (B) and the input end of the scanning signals $V_g1$, when the first TFT T1 and the second TFT T2 are turned off, $V_g$ may decrease quickly in a short time period. A difference between gate voltage $V_g11$ of the second TFT T2 and the gate voltage $V_g12$ of the second TFT T2 is large, i.e., the feed through voltage $\Delta V$ is large, and the corresponding pixel voltage $V_s12$ is small. As such, display brightness may be normal. Due to the distance between the pixel cells 101 within the second area (B) and the input end of the scanning signals $V_g1$ is greater than the distance between the pixel cells 102 within the first area (A) and the input end of the scanning signals $V_g1$, when the first TFT T1 and the second TFT T2 are turned off, time-delay resulted from resistors and capacitors may occur in the pixel cells 101 within the second area (B). The pixel voltage $V_g'$ may decrease slowly, and the difference between the gate voltage $V_g11'$ of the first TFT T1 and the gate voltage $V_g12'$ of the first TFT T1 is smaller than the difference between gate voltage $V_g11$ of the second TFT T2 and the gate voltage $V_g12$ of the second TFT T2, i.e., the feed through voltage $\Delta V'$ is smaller than $\Delta V$, and the corresponding pixel voltage $V_s12'$ is larger than $V_s12$, resulting in a higher display brightness and at least one bright spot generated on the display panel. When the scanning signals $V_g2$ are inputted from the scanning line G2 at the next row, the third TFT T3 may be turned on. According to charge sharing principle, the pixel voltage $V_s12'$ of the pixel cells 101 within the second area (B) may be pulled-down and may be equalized with the pixel voltage $V_s12$ of the pixel cells within the first area (A). A time interval between the scanning signals $V_g1$ inputted from the scanning line G1 at the current row and the scanning signals $V_g2$ inputted from the scanning line G2 at the next row is short and human eye may not be able to distinguish. Users may only recognize the pixel cells 101 within the second area (B), which have been operated by the third TFT T3. As such, brightness of the pixel cells 101 within the second area (B) may be equal to that of the pixel cells 102 within the first area (A). The scanning lines may conduct a scanning process in sequence. The pixel voltage of the pixel cells 101 within a right-side of the second area (B) may be pulled-down by the third TFT T3. As such, the pixel voltage of the pixel cells 101 within the second area (B) may be equal to that of the pixel cells 102 within the first area (A), and the brightness of the both sides of the array substrate may be the same.

In view of the above, each of the pixel cells within the second area, wherein the distance between the second area and the input end of scanning signals is greater than the distance between the first area and the input end of the scanning signals, includes the control unit configured to reduce the pixel voltage of the pixel cells within the second area. So as to equalize the pixel voltage of the pixel cells over the array substrate. As such, a whitening problem occurred at the right-side rim and the left-side rim of the panel may be solved, the display panel may display images uniformly, and display performance of the display panel may be improved.

Figure 5:
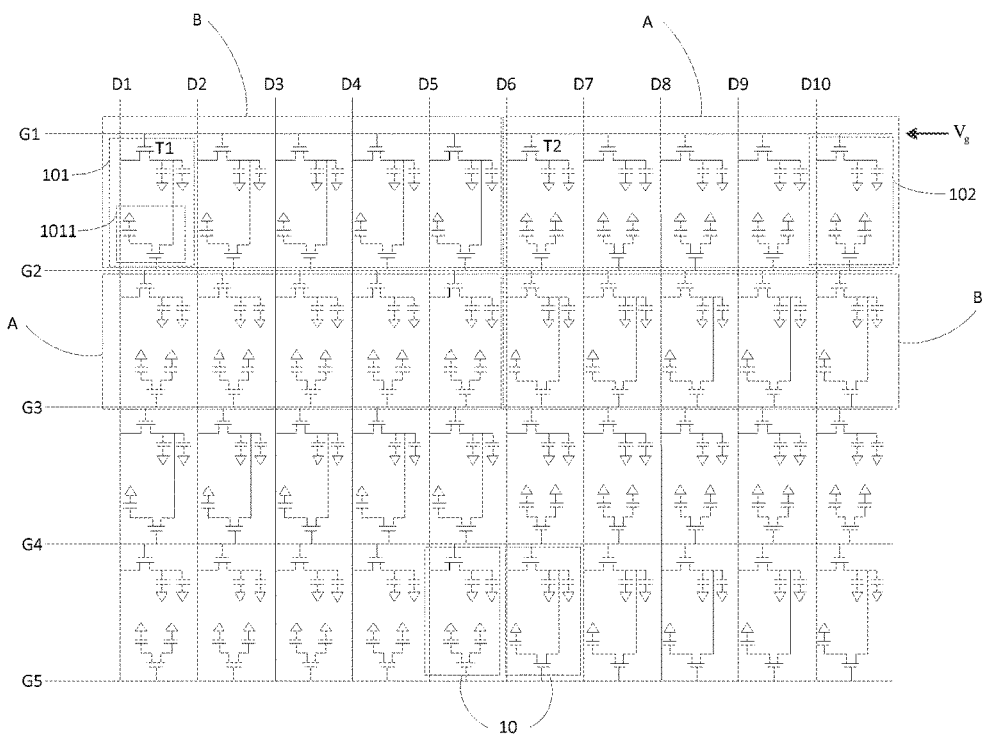
FIG. 5 is a schematic view of the array substrate in accordance of another embodiment of the present disclosure.
Figure 6:
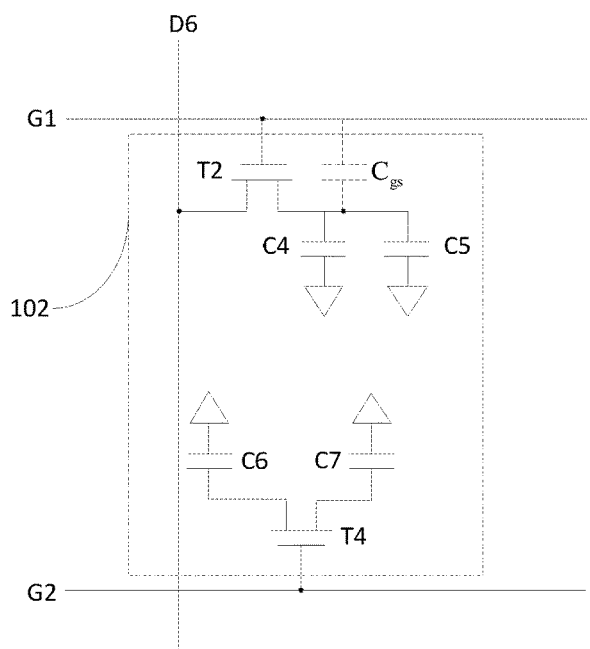
FIG. 6 is a schematic view of the pixel cell within the first area of the array substrate in accordance of another embodiment of the present disclosure.

Referring to FIG. 5 and FIG. 6, the present disclosure further relates to the array substrate, including: a plurality of the scanning lines Gn (for example G1, G2, G3, G4 and G5 in the present embodiment), a plurality of the data lines Dn (for example D1, D2, D3, D4, D5, D6, D7, D8, D9 and D10 in the present embodiment). The data lines Dn and the scanning lines Gn respectively intersect with each other to form a plurality of the pixel cells 10.

The pixel cells 10 may be divided into the pixel cells within the first area (A) and the pixel cells within the second area (B) along the direction of the scanning lines Gn. The distance between the first area (A) and the input end of scanning signals is less than the distance between the second area (B) and the input end of the scanning signals. Each of the pixel cells 101 within the second area (B) includes the first TFT T1 and the control unit 1011 connected to the first TFT T1. The control unit 1011 is configured to reduce the pixel voltage of the pixel cell 101 where the first TFT T1 is configured. Each of the pixel cells within the first area (A) may include the second TFT T2 and a fourth TFT T4.

Specifically, each of the pixel cells within the first area (A) may further include a second liquid crystal capacitor C4, a second storage capacitor C5, a second capacitor C6, and a third capacitor C7. A source of the second TFT T2 connects to the data line D6. A gate of the second TFT T2 connects to the scanning line G1 at the current row. A drain of the second TFT T2 connects to the pixel electrode of the pixel cell 102 where the second TFT T2 is configured. Wherein the second liquid crystal capacitor C4 is equivalently formed by the pixel electrode of the pixel cell 102, where the second TFT T2 is configured, and the common electrode of the color film substrate (not shown). The second storage capacitor C5 is equivalently formed by the pixel electrode of the pixel cell 102, where the second TFT T2 is configured, and the other metal lines of the array substrate. A gate of the fourth TFT T4 connects to the scanning line at the next row. A source of the fourth TFT T4 is grounded via the second capacitor C6. A drain of the fourth TFT T4 is grounded via the third capacitor C7. Wherein the second capacitor C6 is equivalently formed by the source of the fourth TFT T4 and the common electrode, and the third capacitor C7 is equivalently formed by the drain of the fourth TFT T4 and the common electrode. Due to an input-direction of the scanning line may not be determined when manufacturing the array substrate, the fourth TFT T4 is configured in the pixel cell 102 within the first area (A) to adjust a connection between the control unit 1011 and the fourth TFT T4 according to the input-direction of the scanning line. So as to guarantee consistency of liquid crystal display (LCD) panels.

In view of the above, each of the pixel cells within the second area includes the control unit, and each of the pixel cells within the first area includes the TFT. Wherein the distance between the second area and the input end of scanning signals is greater than the distance between the first area and the input end of the scanning signals. So as to reduce the pixel voltage of the pixel cells within the second area, to equalize the pixel voltage of the pixel cells over the array substrate, and to maintain the consistency of the display panel. As such, the whitening problem occurred at the right-side rim and the left-side rim of the display panel may be solved, the display panel may display images uniformly, and display performance of the display panel may be improved.

Figure 7:
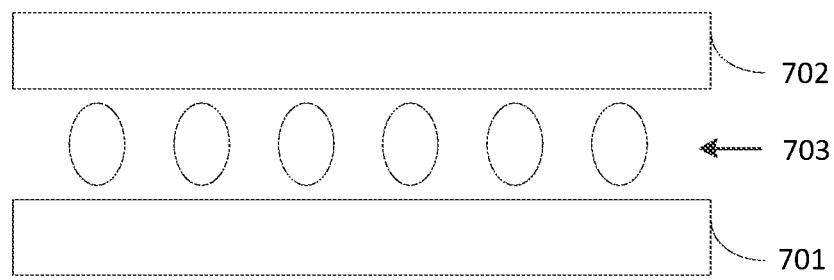
FIG. 7 is a schematic view of a display panel in accordance of one embodiment of the present disclosure.

Referring to FIG. 7, the present disclosure further relates to the display panel, including: a first substrate 701, a second substrate 702, and a liquid crystal layer 703 configured between the first substrate 701 and the second substrate 702. The first substrate 701 is configured to be the array substrate, which is described in above. Therefore, the detail description of the array substrate may not be repeat again.

In view of the above, each of the pixel cells within the second area, wherein the distance between the second area and the input end of scanning signals is greater than the distance between the first area and the input end of the scanning signals, includes the control unit configured to reduce the pixel voltage of the pixel cells within the second area. So as to equalize the pixel voltage of the pixel cells over the array substrate. As such, the whitening problem occurred at the right-side rim and the left-side rim of the display panel may be solved, the display panel may display images uniformly, and display performance of the display panel may be improved.

The above description is merely the embodiments in the present disclosure, the claim is not limited to the description thereby. The equivalent structure or changing of the process of the content of the description and the figures, or to implement to other technical field directly or indirectly should be included in the claim.

What is claimed is:

1. An array substrate, comprising: a plurality of scanning lines;

a plurality of data lines, wherein the data lines and the scanning lines respectively intersect with each other to form a plurality of pixel cells;

wherein the pixel cells are divided into the pixel cells within a first area and the pixel cells within a second area along the scanning lines, and a distance between the first area and an input end of scanning signals is less than a distance between the second area and the input end of the scanning signals, the pixel cells within a first area have different thin film transistor (TFT) and capacitor configurations, and the pixel cells within a second area have different thin film transistor (TFT) and capacitor configurations;

each of the pixel cells within the second area comprises a first thin film transistor (TFT) and a control unit connected to the first TFT, the control unit is configured to reduce a pixel voltage of the pixel cell where the first TFT is configured, and each of the pixel cells within the first area comprises a second TFT;

the control unit comprises a third TFT and a first capacitor, a drain of the third TFT connects to a pixel electrode of the pixel cell where the third TFT is configured, and a gate of the third TFT connects to a scanning line at a next row;

each of the pixel cells within the first area comprises a fourth TFT, a gate of the fourth TFT connects to the scanning line at the next row, a source of the fourth TFT is grounded via a second capacitor, and a drain of the fourth TFT is grounded via a third capacitor; and the first TFT disposed in the pixel cells within the second area and the second TFT disposed in the pixel cells within the first area are different TFTs respectively, the third TFT disposed in the pixel cells within the second area and the fourth TFT disposed in the pixel cells within the first area are different TFTs respectively, and the first capacitor and the third capacitor are different capacitors.

2. The array substrate according to claim 1, wherein a source of the first TFT connects to the data line, a gate of the first TFT connects to a scanning line at a current row, a drain of the second TFT connects to the pixel electrode of the pixel cell where the first TFT is configured.

3. The array substrate according to claim 2, wherein when the scanning signals are inputted from the scanning line at the current row, the third TFT at the current row is turned off, and the first TFT and the second TFT at the current row are turned on;

when the scanning signals are inputted from the scanning line at the next row, the third TFT at the current row is turned on, and the first TFT and the second TFT at the current row are turned off;

the third TFT at the current row is configured to pull-down the pixel voltage of the current row.

4. The array substrate according to claim 3, wherein the third TFT in the second area is configured to pull-down the pixel voltage of the current row, and to equalize the pixel voltage of the current row with a pixel voltage of the pixel cell within the first area.

5. The array substrate according to claim 1, wherein the first area and the second area are divided by mid-points of each of the scanning lines.

6. The array substrate according to claim 1, wherein the first area and the second area are divided by a whitening area of a current row;

the first area corresponds to a non-whitening area of the current row, and the second area corresponds to the whitening area of the current row.

7. The array substrate according to claim 1, wherein the first area and the second area are divided by a whitening area configured on a different row;

the first area corresponds to a whitening area of a next row, and the second area corresponds to be the whitening area of a current row.

8. A display panel, comprising:

a plurality of data lines, wherein the data lines and the scanning lines respectively intersect with each other to form a plurality of pixel cells;

wherein the pixel cells are divided into the pixel cells within a first area and the pixel cells within a second area along the scanning lines, and a distance between the first area and an input end of scanning signals is less than a distance between the second area and the input end of the scanning signals 1 the pixel cells within a first area have different thin film transistor (TFT) and capacitor configurations, and the pixel cells within a second area have different thin film transistor (TFT) and capacitor configurations;

each of the pixel cells within the second area comprises a first TFT and a control unit connected to the first TFT, the control unit is configured to reduce a pixel voltage of the pixel cell where the first TFT is configured, and each of the pixel cells within the first area comprises a second TFT;

the control unit comprises a third TFT and a first capacitor, a drain of the third TFT connects to a pixel electrode of the pixel cell where the third TFT is configured, and a gate of the third TFT connects to a scanning line at a next row;

each of the pixel cells within the first area comprises a fourth TFT, a gate of the fourth TFT connects to the scanning line at the next row, a source of the fourth TFT is grounded via a second capacitor, and a drain of the fourth TFT is grounded via a third capacitor; and the first TFT disposed in the pixel cells within the second area and the second TFT disposed in the pixel cells within the first area are different TFTs respectively, the third TFT disposed in the pixel cells within the second area and the fourth TFT disposed in the pixel cells within the first area are different TFTs respectively, and the first capacitor and the third capacitor are different capacitors.

9. The display panel according to claim 8, wherein a source of the first TFT connects to the data line, a gate of the first TFT connects to a scanning line at a current row, a drain of the second TFT connects to the pixel electrode of the pixel cell where the first TFT is configured.

10. The display panel according to claim 9, wherein when the scanning signals are inputted from the scanning line at the current row, the third TFT at the current row is turned off, and the first TFT and the second TFT at the current row are turned on;

when the scanning signals are inputted from the scanning line at the next row, the third TFT at the current row is turned on, and the first TFT and the second TFT at the current row are turned off;

the third TFT at the current row is configured to pull-down the pixel voltage of the current row.

11. The display panel according to claim 8, wherein the third TFT in the second area is configured to pull-down the pixel voltage of the current row, and to equalize the pixel voltage of the current row with a pixel voltage of the pixel cell within the first area.

12. The display panel according to claim 8, wherein the first area and the second area are divided by mid-points of each of the scanning lines.

13. The display panel according to claim 8, wherein the first area and the second area are divided by a whitening area of a current row;

the first area corresponds to a non-whitening area of the current row, and the second area corresponds to the whitening area of the current row.

14. The display panel according to claim 8, wherein the first area and the second area are divided by a whitening area configured on a different row;

the first area corresponds to a whitening area of a next row, and the second area corresponds to be the whitening area of a current row.

\* \* \* \* \*